(12) United States Patent
Akiyama

(10) Patent No.: US 10,903,323 B2
(45) Date of Patent: Jan. 26, 2021

(54) SEMICONDUCTOR DEVICE

(71) Applicant: SUMITOMO ELECTRIC DEVICE INNOVATIONS, INC., Kanagawa (JP)

(72) Inventor: Chihoko Akiyama, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 16/561,408

(22) Filed: Sep. 5, 2019

(65) Prior Publication Data

US 2020/0091302 A1 Mar. 19, 2020

(30) Foreign Application Priority Data

Sep. 13, 2018 (JP) .................................. 2018-171589

(51) Int. Cl.
| | | |
|---|---|---|
| *H01L 29/417* | (2006.01) | |
| *H01L 29/20* | (2006.01) | |
| *H01L 29/205* | (2006.01) | |
| *H01L 29/66* | (2006.01) | |
| *H01L 29/778* | (2006.01) | |
| *H01L 21/285* | (2006.01) | |
| *H01L 29/47* | (2006.01) | |

(52) U.S. Cl.
CPC .. *H01L 29/41758* (2013.01); *H01L 21/28581* (2013.01); *H01L 29/2003* (2013.01); *H01L 29/205* (2013.01); *H01L 29/475* (2013.01); *H01L 29/66462* (2013.01); *H01L 29/7786* (2013.01)

(58) Field of Classification Search
CPC ........... H01L 29/41758; H01L 29/2003; H01L 29/205; H01L 29/475; H01L 29/66462; H01L 29/7786; H01L 21/28581
See application file for complete search history.

(56) References Cited

U.S. PATENT DOCUMENTS

| | | | |
|---|---|---|---|
| 2012/0267795 A1* | 10/2012 | Shimura | ............. H01L 23/4821 257/776 |
| 2013/0109168 A1* | 5/2013 | Kajii | ................. H01L 21/28264 438/605 |
| 2018/0197978 A1* | 7/2018 | Matsuda | ............. H01L 29/7787 |

FOREIGN PATENT DOCUMENTS

JP 2001-284367 10/2001

* cited by examiner

*Primary Examiner* — Seahvosh Nikmanesh
(74) *Attorney, Agent, or Firm* — Smith, Gambrell, Russell, LLP.

(57) ABSTRACT

A semiconductor device includes a substrate, an active region and an inactive region surrounding the active region, a gate electrode, a drain electrode and a source electrode on the active region, a drain interconnection including a drain finger and a drain bar, and a source interconnection including a source finger and a source bar. The source bar is located on an opposite side of the drain bar across the active region in a first direction. The source electrode includes a first side facing the drain bar in the first direction and a first depression in a middle of the first side. A first depth of the first depression in the first direction is equal or more than a first interval between the drain bar and the first side in the first direction.

14 Claims, 11 Drawing Sheets

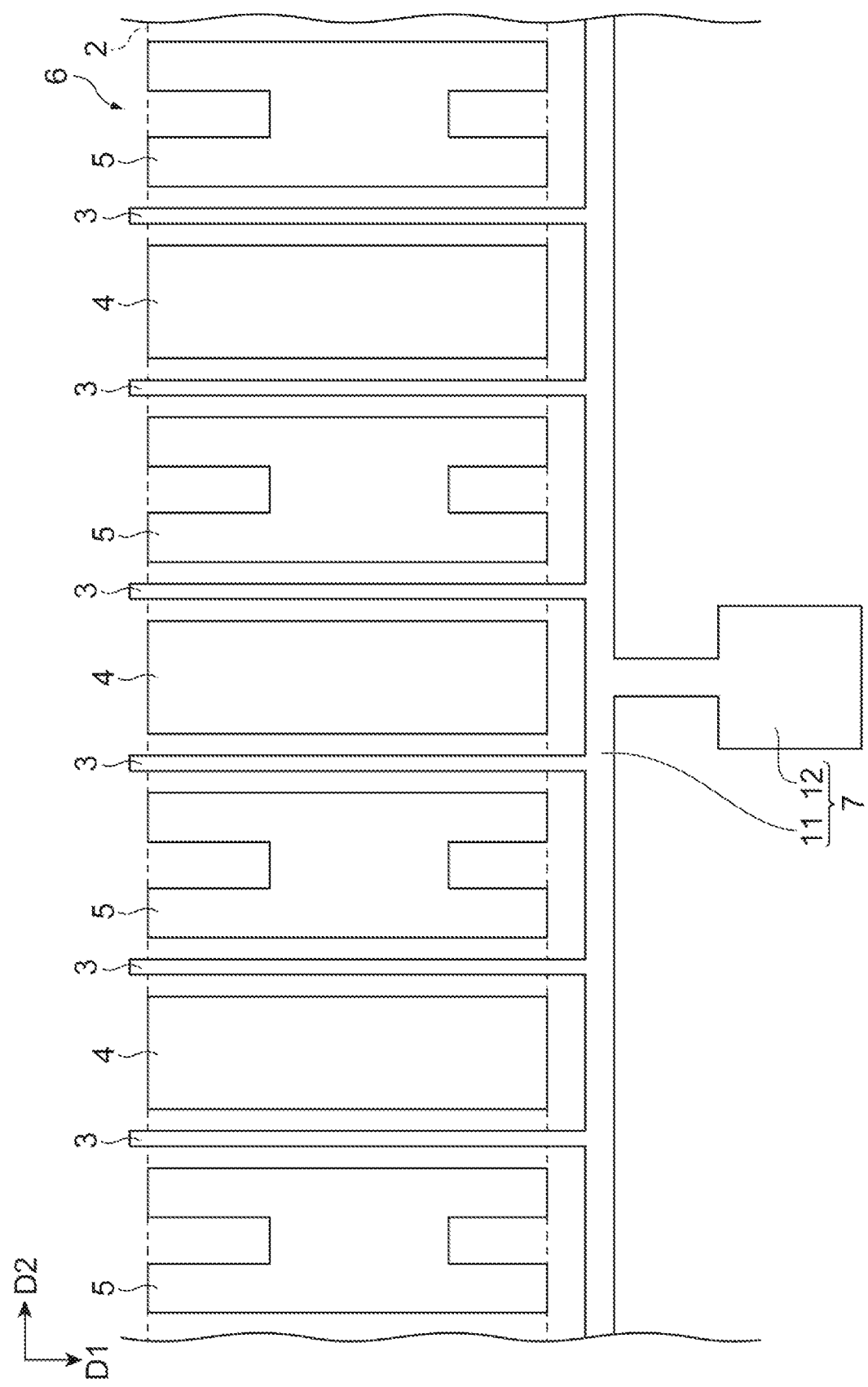

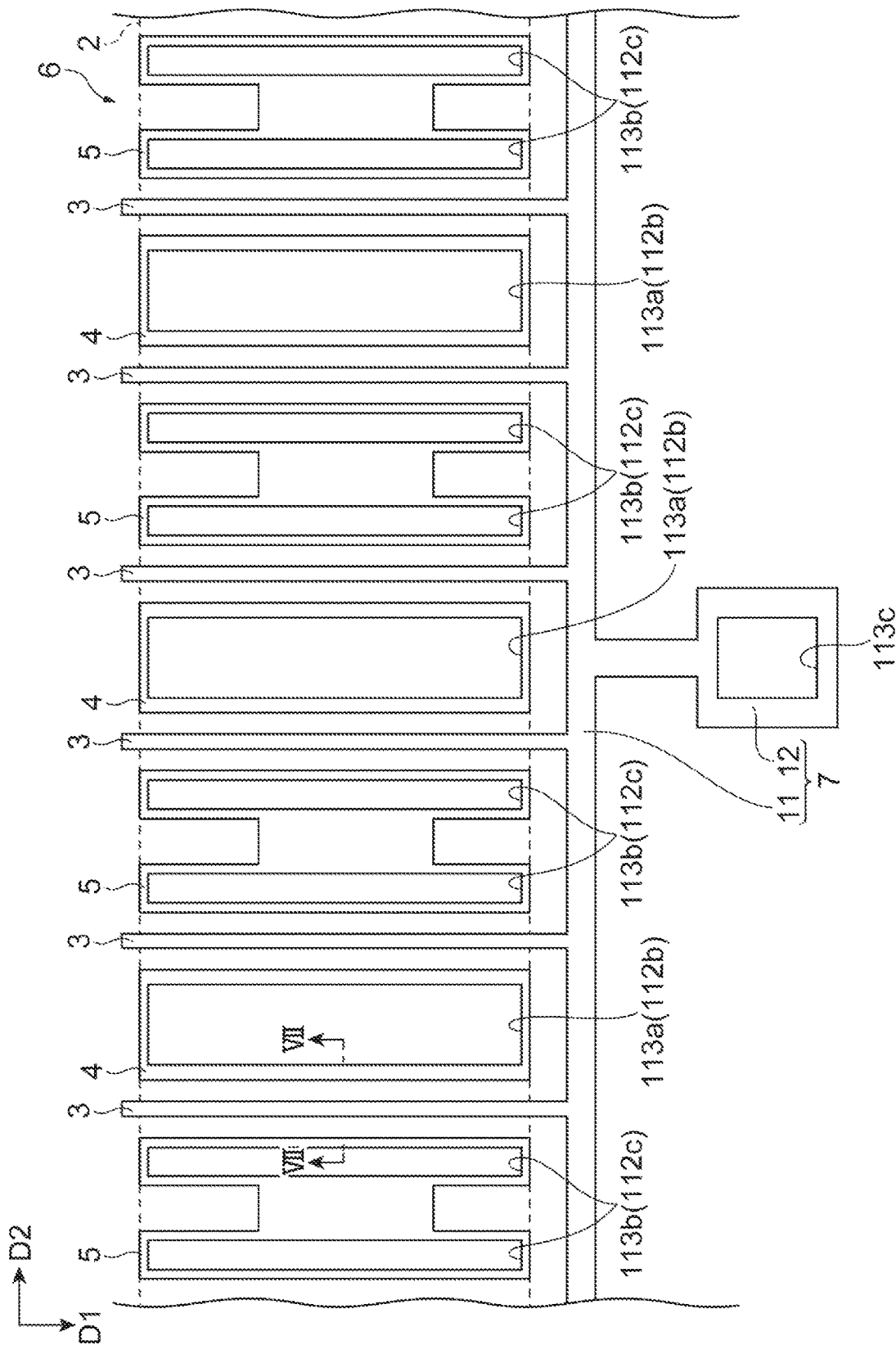

SEMICONDUCTOR DEVICE

CROSS REFERENCE TO RELATED APPLICATIONS

This application claims the benefit of priority from Japanese Application No. JP2018-171589 filed on Sep. 13, 2018, the entire contents of which are incorporated herein by references.

TECHNICAL FIELD

The present disclosure relates to a semiconductor device.

BACKGROUND

As a semiconductor device, for example, a high frequency field effect transistor (FET) described in Japanese Unexamined Patent Publication No. 2001-284367 can be mentioned. The FET in Japanese Unexamined Patent Publication No. 2001-284367 includes a source ohmic electrode and a drain ohmic electrode. The source ohmic electrode is connected to a source extraction electrode through a source finger. The drain ohmic electrode is connected to a drain extraction electrode through a drain finger. The tip of the source finger is retracted relative to the source ohmic electrode, and the tip of the drain finger is retracted relative to the drain ohmic electrode. In order to improve the high frequency characteristics of the FET as disclosed in Japanese Unexamined Patent Publication No. 2001-284367, it is effective to suppress local heat generation and reduce parasitic capacitance.

SUMMARY

According to one embodiment of the present disclosure, there is provided a semiconductor device including: a substrate; an active region and an inactive region surrounding the active region, the active region and the inactive region being located on the substrate; a gate electrode, a drain electrode and a source electrode on the active region, the gate electrode, the drain electrode and the source electrode extending in a first direction; a drain interconnection including a drain finger having a pattern along a planer shape of the drain electrode, and a drain bar on the inactive region, the drain bar extending in a second direction intersecting with the first direction and being connected to the drain finger; and a source interconnection including a source finger having a pattern along a planar shape of the source electrode, and a source bar on the inactive region, the source bar extending in the second direction and being connected to the source finger. The source bar is located on an opposite side of the drain bar across the active region in the first direction, the source electrode includes a first side facing the drain bar in the first direction and a first depression in a middle of the first side, and a first depth of the first depression is equal or more than a first interval between the drain bar and the first side.

BRIEF DESCRIPTION OF THE DRAWINGS

The foregoing and other purposes, aspects and advantages will be better understood from the following detailed description of a preferred embodiment of the disclosure with reference to the drawings, in which:

FIG. 5 is a view for explaining the method of manufacturing the transistor according to the embodiment, and is a schematic plan view when a gate electrode is formed;

FIG. 6 is a view for explaining the method of manufacturing the transistor according to the embodiment, and is a schematic plan view when each opening is formed in an insulating film;

DETAILED DESCRIPTION

Figure 1:
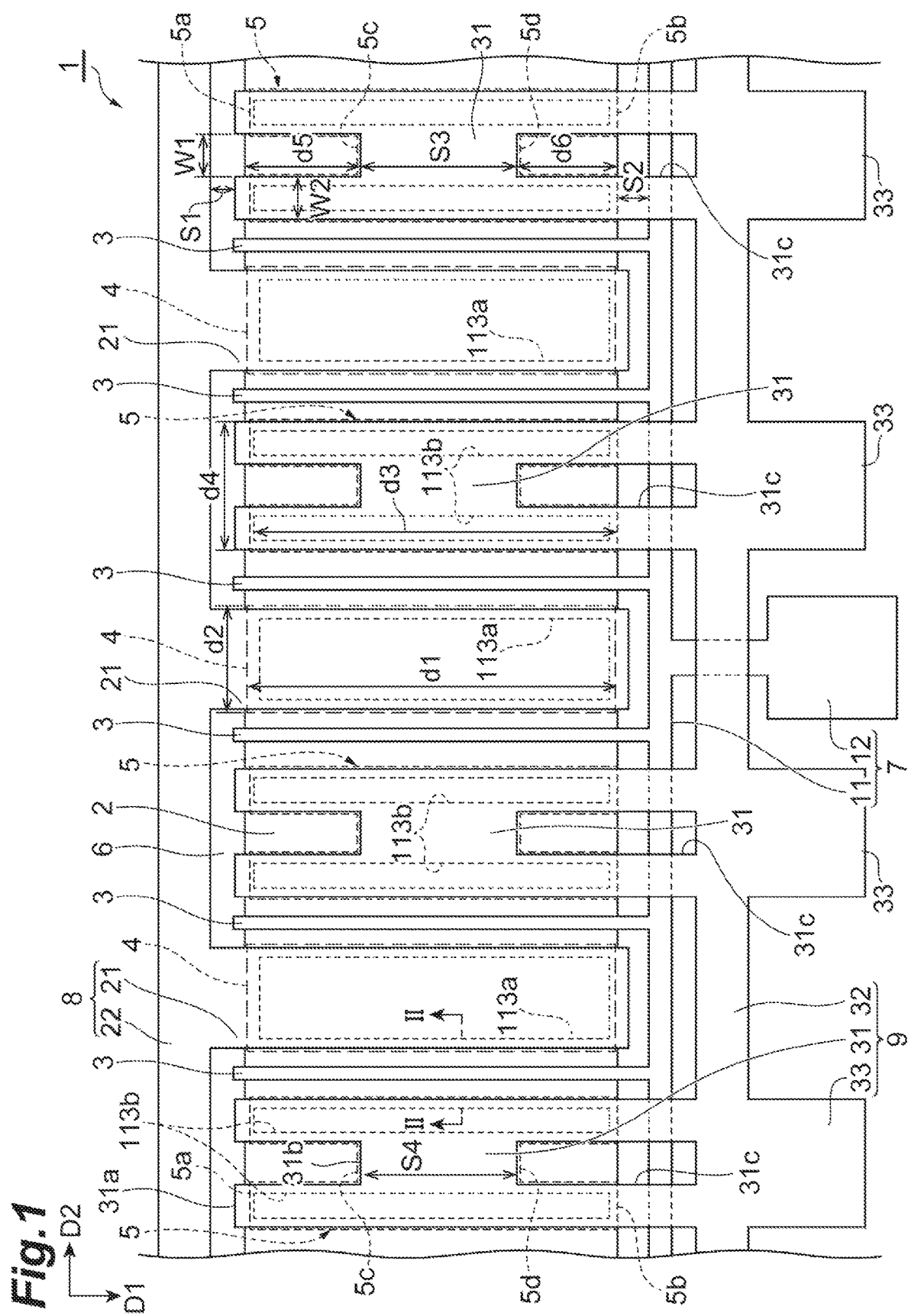
FIG. 1 is a schematic plan view illustrating an example of a semiconductor device according to an embodiment.

Problem to be Solved by the Present Disclosure

The resistance value of the FET of Japanese Unexamined Patent Publication No. 2001-284367 tends to rise due to the retracted source finger and drain finger. Due to the increase in resistance value, local heat generation tends to occur in the FET. In order to reduce the local heat generation, it is conceivable to align the tip of the source finger with the source ohmic electrode and align the tip of the drain finger with the drain ohmic electrode. In this case, for example, parasitic capacitance between the drain finger and the source extraction electrode is increased.

An embodiment of the present disclosure is a semiconductor device including an active region and an outer region surrounding the active region; a gate electrode, a drain electrode, and a source electrode which extend along a first direction on the active region; a drain wiring including a drain finger having a shape corresponding to a planar shape of the drain electrode and a drain bar extending in a second direction orthogonal to the first direction in the outer region and connected to the drain finger; and a source wiring including a source finger having a shape corresponding to a planar shape of the source electrode and a source bar extending along the second direction in the outer region and connected to the source finger, wherein the source bar is located on an opposite side of the drain bar across the active region, and wherein in each of the source electrode and the source finger, a first depression which is provided at a central portion of a first side facing the drain bar and is depressed to a depth equal to or more than an interval between both side portions of the first side and the drain bar. The source bar is located on the opposite side of the drain bar across the active region, each of the source electrode and the source finger includes a first depression provided at a middle portion of a first side thereof facing the drain bar, and the first depression is depressed to a depth equal to or more than an interval between the first side and the drain bar.

Effect of the Present Disclosure

According to one aspect of the present disclosure, a semiconductor device capable of suppressing local heat generation and an increase in parasitic capacitance can be provided.

Description of Embodiments of the Present Disclosure

Specific examples of a semiconductor device according to an embodiment of the present disclosure will be described below with reference to the drawings. Further, it is to be understood that the present disclosure is not limited to these examples but is defined by the scope of the claims and includes all modifications within the meaning and scope equivalent to the claims. In the following description, the same elements are denoted by the same reference numerals in the description of the drawings, and redundant explanations are omitted.

FIG. 1 is a schematic plan view illustrating an example of a semiconductor device according to the present embodiment. A transistor 1 which is the semiconductor device illustrated in FIG. 1 is a multi-finger transistor including a plurality of transistors connected in parallel to one another, and is used as, for example, a power device. The transistor 1 is provided in the active region 2, and includes a plurality of gate electrodes 3, a plurality of drain electrodes 4, and a plurality of source electrodes 5. The active region 2 is a semiconductor region surrounded by an inactive region (outer region) 6 in plan view. Each of the active region 2 and the inactive region 6 is provided on a substrate 101 described later.

The plurality of gate electrodes 3 are conductors extending along one direction on the active region 2. Hereinafter, the direction in which the gate electrode 3 extends is referred to as a first direction D1, and the direction orthogonal to the first direction D1 in plan view is referred to as a second direction D2. A part of each gate electrode 3 extends not only on the active region 2 but also on the inactive region 6. The parts are mutually connected through a gate wiring 7. The gate wiring 7 has a gate bar 11 extending in the second direction D2 and a gate pad 12 connected to the gate bar 11. The gate bar 11 is located on the inactive region 6. The gate pad 12 is located on the opposite side of the gate electrode 3 through the gate bar 11. The gate electrode 3 and the gate wiring 7 are formed simultaneously.

Similar to the gate electrode 3, the plurality of drain electrodes 4 are conductors extending along the first direction D1 on the active region 2. The length d1 of the drain electrode 4 along the first direction D1 is, for example, 350 µm. The length d1 is substantially the same as the length of the active region 2 along the first direction D1. The length d2 of the drain electrode 4 along the second direction D2 is, for example, 20 µm or more and 40 µm or less. The interval between the two gate electrodes 3 sandwiching the drain electrode 4 in the second direction D2 is, for example, 25 µm or more and 45 µm or less. The material or the like which constitutes the drain electrode 4 is described later.

A drain wiring (drain interconnection) 8 is located on each drain electrode 4. The drain wiring 8 is a conductor connected to the drain electrode 4, and includes a drain finger 21 having a shape corresponding to the planar shape of the drain electrode 4 and a drain bar 22 connected to the drain finger 21. A part of the drain finger 21 extends not only on the active region 2 but also on the inactive region 6. Therefore, the drain finger 21 includes a region located on the active region 2 and having a shape corresponding to the planar shape of the drain electrode 4, and a region located on the inactive region 6. The drain finger 21 is connected to the drain electrode 4 through an opening 112b of a second SiN film 112 covering the drain electrode 4 and an opening 113a of an insulating film 113 (see FIG. 2 described later). The drain bar 22 is a conductor for connecting the drain fingers 21, and extends on the inactive region 6 along the second direction D2. The drain bar 22 is connected to the region located on the inactive region 6 in the drain finger 21. The drain finger 21 and the drain bar 22 are formed simultaneously.

Similar to the gate electrode 3 and the drain electrode 4, the plurality of source electrodes 5 are conductors extending along the first direction on the active region 2. The length d3 of the source electrode 5 along the first direction D1 is, for example, 350 µm. The length d4 of the source electrode 5 along the second direction D2 is, for example, 25 µm or more and 80 µm or less. The gate electrode 3, the source electrode 5, the gate electrode 3, and the drain electrode 4 are provided in this order on the active region 2 in the second direction D2. The material or the like which constitutes the source electrode 5 is described later.

A source wiring (source interconnection) 9 is located on each source electrode 5. The source wiring 9 is a conductor connected to the source electrode 5, and has a source finger 31 having a shape corresponding to the planar shape of the source electrode 5, a source bar 32 connected to the source finger 31, and a source pad 33 connected to the source bar 32. A part of the source finger 31 extends not only on the active region 2 but also on the inactive region 6. Therefore, the source finger 31 includes a region located on the active region 2 and having a shape corresponding to the planar shape of the source electrode 5, and a region located on the inactive region 6. The source finger 31 is connected to the source electrode 5 through an opening 112c of the second SiN film 112 covering the source electrode 5 and an opening 113b of the insulating film 113 (see FIG. 2 described later). The source bar 32 is a conductor for connecting the source fingers 31, and extends on the inactive region 6 along the second direction D2. The source bar 32 is located on the opposite side of the drain bar 22 across the active region 2 in plan view. The source bar 32 is located on the opposite side of the active region 2 through the gate bar 11 in plan view. In other words, the gate bar 11 is located between the source bar 32 and the active region 2 in plan view. The source bar 32 is connected to the region located on the inactive region 6 in the source finger 31. The source pad 33 is located on the opposite side of the source finger 31 across the source bar 32. Although the source wiring 9 has a plurality of source pads 33 in the present embodiment, the present invention is not limited to this. The source finger 31, the source bar 32, and the source pad 33 are simultaneously formed.

Next, specific shapes of the source electrode 5 and the source finger 31 in plan view will be described. First, the shape of the source electrode 5 in plan view will be described. The source electrode 5 has a side 5a (first side) facing the drain bar 22 in the first direction D1 and a side 5b (second side) facing the gate bar 11 in the first direction D1. The side 5a extends along the second direction D2, and has a central portion (middle) and both side portions sandwiching the central portion. The longer the length of the central portion in the second direction D2, the better. For example, the length of the central portion relative to the side 5b is 40% or more and 90% or less. In one example, the length W1 of the central portion along the second direction D2 is, for example, 15 µm or more and 60 µm or less, and the length W2 of each side portion along the second direction D2 is, for example, 5 µm or more 10 µm or less. In the central portion of the side 5a, a depression 5c (first depression) which is depressed relative to both side portions of the side 5a is provided. Thus, the central portion of the side 5a is located closer to the center of the source electrode 5 than the side portions of the side 5a. The interval S1 between the drain bar 22 and both side portions of the side 5a along the first direction D1 is, for example, 15 µm or more and 30 µm or less. On the other hand, the depth d5 of the depression 5c along the first direction D1 is equal to or greater than the interval S1, and is, for example, 15 µm or more and 100 µm or less.

The side 5b extends along the second direction D2 similarly to the side 5a, and has a central portion and both side portions sandwiching the central portion. The longer the central portion in the second direction D2, the better. In one example, the length of the central portion of the side 5b is the same as the length W1 of the central portion of the side 5a. In the central portion of the side 5b, a depression 5d (second depression) which is depressed relative to both side portions of the side 5b is provided. Here, an interval S2 between the gate bar 11 and both side portions of the side 5b along the first direction D1 is, for example, 15 µm or more and 30 µm or less. On the other hand, the depth d6 of the depression 5d along the first direction D1 is equal to or greater than the interval S2, and is, for example, 15 µm or more and 100 µm or less. Therefore, the source electrode 5 has a substantially H-shaped shape in plan view. The interval S3 between the depressions 5c and 5d along the first direction D1 is $^{150}\!/\!_{350}$ or less of the length d3 of the source electrode 5.

Subsequently, the shape of the source finger 31 in plan view will be described. As described above, the source finger 31 of the source wiring 9 includes the region having a shape corresponding to the planar shape of the source electrode 5. The source finger 31 has a side 31a (fifth side) opposed to the drain bar 22 in the first direction D1. The side 31a is provided along the side 5a, and has a central portion and both side portions sandwiching the central portion. The length of the central portion of the side 31a along the second direction D2 is approximately the same as the length W1 of the central portion of the side 5a. At the central portion of the side 31a, a depression 31b (fifth depression) which is depressed relative to both side portions of the side 31a is provided. The depth of the depression 31b along the first direction D1 is approximately the same as the depth d5 of the depression 5c of the source electrode 5. In addition, the source finger 31 has an opening 31c overlapping the depression 5d. The opening 31c is provided on the active region 2 and the inactive region 6. In plan view, the opening 31c in the first direction D1 extends from the source bar 32 to the side 5b. Therefore, the source finger 31 has a substantially H-shaped shape in plan view. In addition, the opening 31c also overlaps the gate bar 11. The interval S4 between the depression 31b and the opening 31c along the first direction D1 is substantially the same as the interval S3 between the depressions 5c and 5d along the first direction D1.

Figure 2:
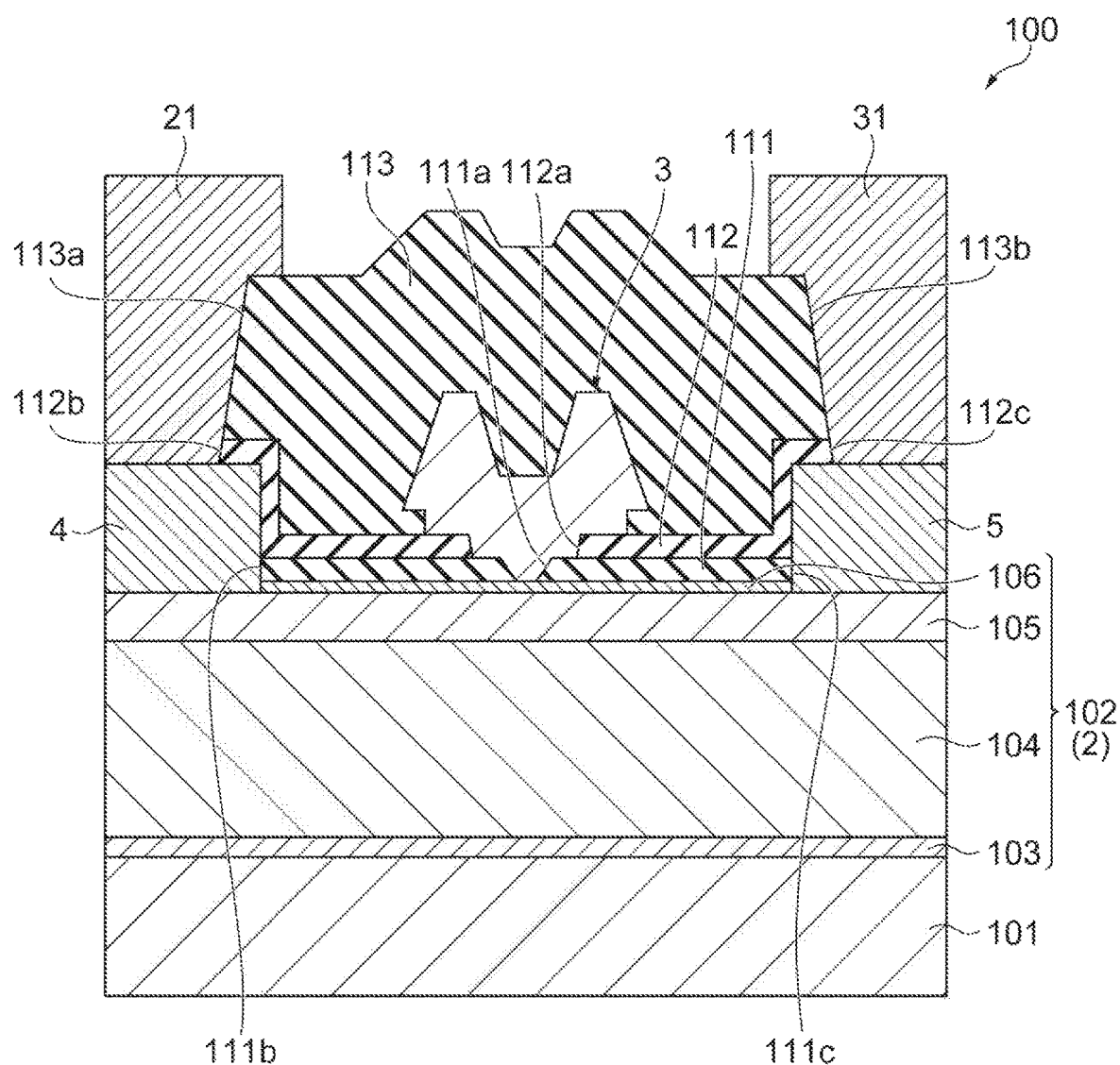
FIG. 2 is a cross-sectional view taken along line II-II of FIG. 1.

Next, the configuration of one field effect transistor (FET) included in the transistor 1 will be described with reference to FIG. 2. FIG. 2 is a cross-sectional view taken along the line II-II of FIG. 1. As shown in FIG. 2, the FET 100 includes a substrate 101, a semiconductor stack 102, a first SiN film 111, a second SiN film 112, a gate electrode 3, a drain electrode 4, a source electrode 5, an insulating film 113, a drain finger 21, and a source finger 31. The semiconductor stack 102 is a semiconductor layer including, in order from the substrate 101, a buffer layer 103, a channel layer 104, a barrier layer 105, and a cap layer 106. The FET 100 is a high electron mobility transistor (HEMT). In the channel layer 104 and in the vicinity of the interface between the channel layer 104 and the barrier layer 105, a 2-dimensional electron gas (2DEG) is generated. Thereby, a channel region is formed in the channel layer 104.

The substrate 101 is a substrate for crystal growth. Examples of the substrate 101 include a SiC substrate, a GaN substrate, or a sapphire ($Al_2O_3$) substrate. The buffer layer 103 is a buffer layer for epitaxially growing the channel layer 104 and the barrier layer 105 on the substrate 101. The buffer layer 103 is made of a nitride semiconductor, and is, for example, an AlN layer. The channel layer 104 is a semiconductor layer epitaxially grown on the buffer layer 103. The channel layer 104 is made of a nitride semiconductor, for example, a GaN layer. The barrier layer 105 is a semiconductor layer epitaxially grown on the channel layer 104. The barrier layer 105 is made of a nitride semiconductor having a higher electron affinity than the channel layer 104, and includes, for example, an AlGaN layer, an InAlN layer, or an InAlGaN layer. The barrier layer 105 may exhibit n-type conductivity. The cap layer 106 is a semiconductor layer epitaxially grown on the barrier layer 105. The cap layer 106 is made of a nitride semiconductor, and, is, for example, a GaN layer. The cap layer 106 may include impurities.

The first SiN film 111 is an insulating protective film provided on the cap layer 106. The first SiN film 111 is provided to protect the surface of the semiconductor stack 102. As described later, the first SiN film 111 is formed by low pressure chemical vapor deposition (LPCVD) or plasma CVD from the viewpoint of enhancing the etching resistance more than the second SiN film 112. The LPCVD is a method of forming a dense film by reducing the film forming pressure and raising the film forming temperature.

In the first SiN film 111, a gate opening 111a, a drain opening 111b, and a source opening 111c are formed. The gate opening 111a is located between the drain opening 111b and the source opening 111c. The cap layer 106 is exposed in the gate opening 111a. The opening width of the gate opening 111a is, for example, 50 nm or more and 600 nm or less. The cap layer 106 is removed in the drain opening 111b and the source opening 111c, and the barrier layer 105 is exposed.

The gate electrode 3 is provided on the region located between the drain electrode 4 and the source electrode 5 in the semiconductor stack 102, and is in contact with the cap layer 106 through the gate opening 111a. Specifically, the gate electrode 3 embeds at least the gate opening 111a. A part of the gate electrode 3 is located on the second SiN film 112. The gate electrode 3 includes a material in Schottky contact with the cap layer 106, and has, for example, a stacked structure of a nickel (Ni) layer and a gold (Au) layer. In this case, the Ni layer is in Schottky contact with the cap layer 106. Examples of the material capable of being Schottky contact with the cap layer 106 include platinum (Pt) and the like in addition to Ni. The thickness of the gate electrode 3 is, for example, 0.3 µm or more and 1 µm or less.

The drain electrode 4 embeds the drain opening 111b, and is provided on the semiconductor stack 102. The drain electrode 4 is in contact with the barrier layer 105 through the drain opening 111b. The source electrode 5 embeds the source opening 111c and is provided on the semiconductor stack 102. The source electrode 5 is in contact with the barrier layer 105 through the source opening 111c. The drain electrode 4 and the source electrode 5 are ohmic electrodes, and are, for example, an alloy of a tantalum (Ta) layer and an aluminum (Al) layer which overlap each other. The drain electrode 4 and the source electrode 5 may be an alloy with a Ta layer, an Al layer, and another Ta layer located on the Al layer. The thickness of the drain electrode 4 and the source electrode 5 is, for example, 0.3 µm or more and 1 µm. A titanium (Ti) layer may be used instead of the Ta layer.

The second SiN film 112 is provided on the first SiN film 111. The second SiN film 112 is formed, for example, by plasma CVD. In the plasma CVD, the film forming temperature is set to a relatively low temperature (for example, 300° C. to 350° C.). The film quality of the SiN film formed by the plasma CVD is sparser than the SiN film formed by the LPCVD. The thickness of the second SiN film 112 is, for example, 30 nm or more and 200 nm or less.

Openings 112a, 112b, 112c are formed in the second SiN film 112. The opening 112a is located on the gate opening 111a of the first SiN film 111, and exposes the gate opening 111a and the periphery of the first SiN film 111. The opening width of the opening 112a is wider than the opening width of the gate opening 111a. The opening 112b is formed in a portion covering the drain electrode 4 in the second SiN film 112, and exposes the upper surface of the drain electrode 4. The opening 112c is formed in a portion covering the source electrode 5 in the second SiN film 112, and exposes the upper surface of the source electrode 5.

The insulating film 113 is a protective film provided on the gate electrode 3, the drain electrode 4, and the source electrode 5. The insulating film 113 is, for example, a SiN film formed by plasma CVD. The thickness of the insulating film 113 is, for example, larger than the thickness of the gate electrode 3, and is 0.5 µm or less and 5 µm or less. In this case, the gate electrode 3 can be well protected. In the insulating film 113, openings 113a, 113b are formed. The opening 113a is provided to overlap the opening 112b and exposes the upper surface of the drain electrode 4. The opening 113a is filled with a conductor constituting the drain finger 21. Therefore, the drain electrode 4 is connected to the drain finger 21 through the openings 112b, 113a. The opening 113b is provided to overlap the opening 112c and expose the upper surface of the source electrode 5. The opening 113b is filled with the conductor constituting the source finger 31. Therefore, the source electrode 5 is connected to the source finger 31 through the openings 112c, 113b.

Figure 7:
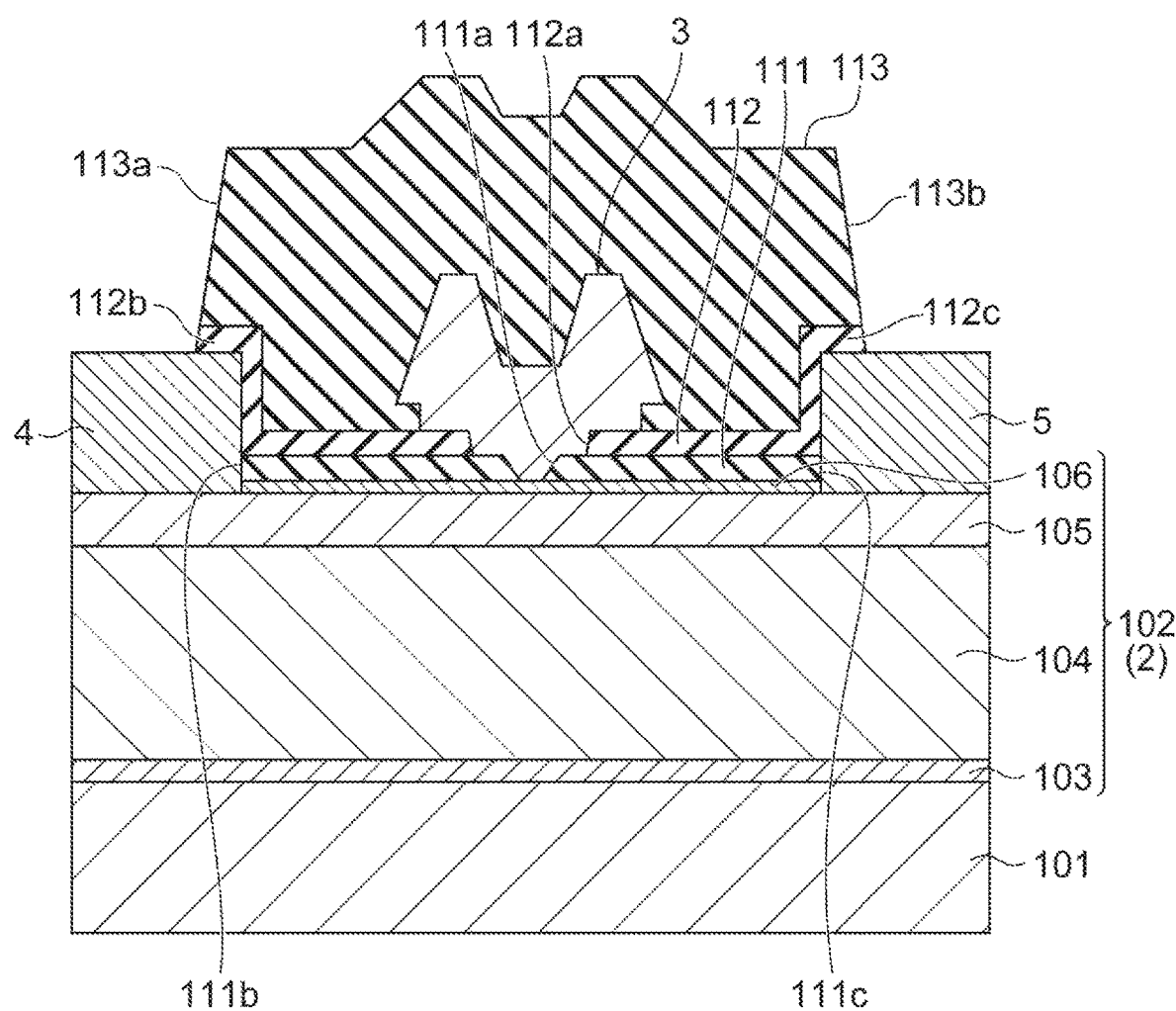
FIG. 7 is a view for explaining the method of manufacturing the transistor according to the embodiment, and is a cross-sectional view taken along line VII-VII in FIG. 6.

Next, a method of manufacturing the transistor 1 will be described with reference to FIGS. 3A to 9B. FIGS. 3A to 3C, 4A to 4C, 5 to 7, 8A, 8B and 9A, 9B are diagrams for explaining a method of manufacturing the transistor 1 according to the present embodiment. FIG. 5 is a schematic plan view when the gate electrode 3 is formed. FIG. 6 is a schematic plan view when each opening is formed in the insulating film 113, and FIG. 7 is a cross-sectional view taken along the line VII-VII in FIG. 6. FIGS. 8A and 8B and FIGS. 9A and 9B are enlarged views of the vicinity of the source finger 31 of the transistor 1.

Figure 3A:
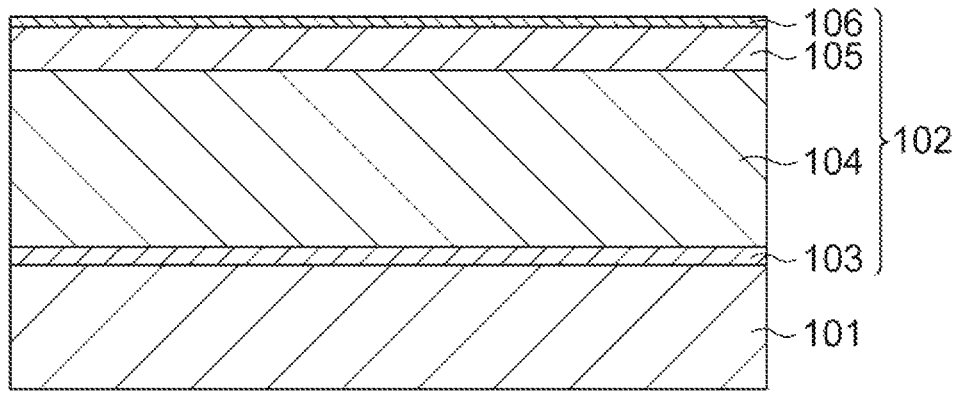
FIGS. 3A to 3C are diagrams illustrating a method of manufacturing a transistor according to the embodiment.

First, as shown in FIG. 3A, a semiconductor stack 102 including a buffer layer 103, a channel layer 104, a barrier layer 105, and a cap layer 106 is formed on a substrate 101. For example, an AlN layer functioning as the buffer layer 103, a GaN layer functioning as the channel layer 104, an AlGaN layer functioning as the barrier layer 105, and a GaN layer functioning as the cap layer 106 are epitaxially grown in this order on the SiC substrate. For example, the semiconductor stack 102 is formed by metal organic chemical vapor deposition (MOCVD). Then, a part of the semiconductor stack 102 is inactivated. Thereby, an active region 2 and an inactive region 6 (see FIG. 1) are formed on the substrate 101. For example, by implanting ions into a part of the semiconductor stack 102, the inactive region 6 is formed in the part. Alternatively, the inactive region 6 may be formed on the substrate 101 by removing the portion other than the active region 2 in the semiconductor stack 102. In this case, the active region 2 has a mesa structure.

Figure 3B:
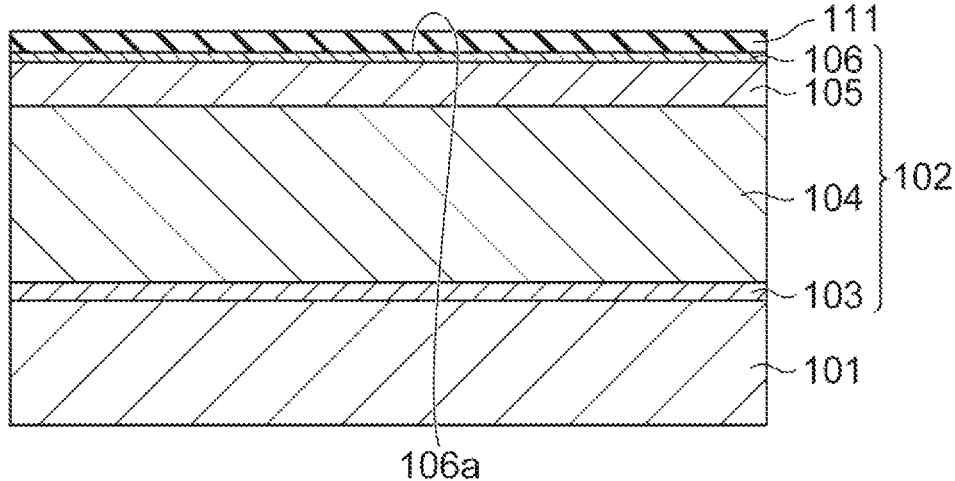

Subsequently, as shown in FIG. 3B, a first SiN film 111 covering the surface (the surface 106a of the cap layer 106) of the semiconductor stack 102 is formed. In this step, the first SiN film 111 is formed on the cap layer 106 by LPCVD using, for example, dichlorosilane gas and ammonia gas as raw materials. The lower limit of the film formation temperature of the first SiN film 111 is, for example, 800° C., and the upper limit thereof is, for example, 900° C. This is a temperature extremely higher than the film forming temperature in the plasma CVD. However, this temperature is lower than the growth temperature of the semiconductor stack 102.

Figure 3C:
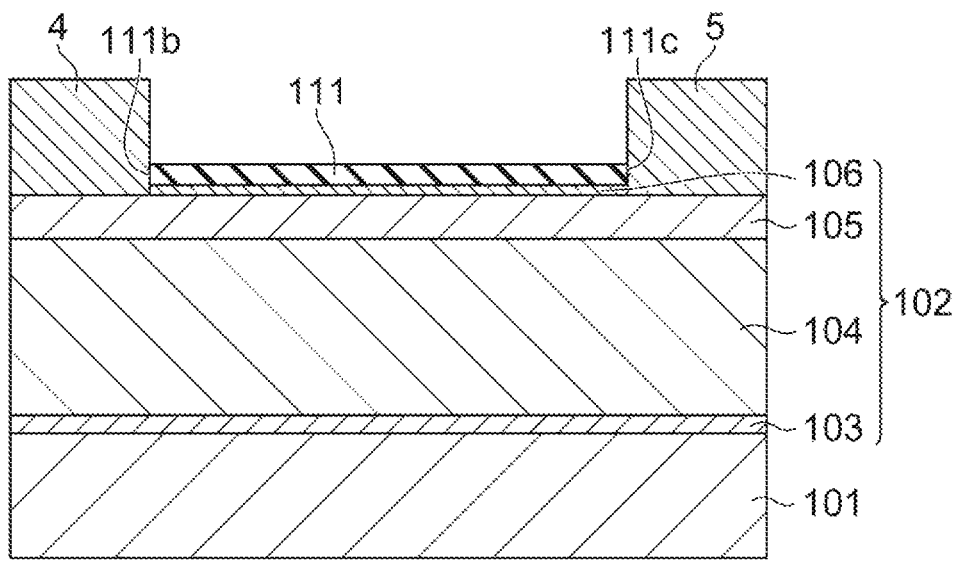

Subsequently, as shown in FIG. 3C, a part of the first SiN film 111 is selectively etched to form a drain opening 111b and a source opening 111c. For example, the drain opening 111b and the source opening 111c are formed in the first SiN film 111 by dry etching using a resist mask. Further, the cap layer 106 in the drain opening 111b and the source opening 111c is removed by dry etching using chlorine-based gas as a reaction gas. Thereby, the barrier layer 105 is exposed in the drain opening 111b and the source opening 111c. Thereafter, the drain electrode 4 is formed in the drain opening 111b, and the source electrode 5 is formed in the source opening 111c. In this step, metals (for example, a Ti layer and an Al layer) for the drain electrode 4 and the source electrode 5 are formed by, for example, physical vapor deposition (PVD) such as vacuum evaporation and liftoff. Thereafter, in order to use these as ohmic electrodes, the above metals are alloyed by heat treatment at, for example, 500° C. to 600° C.

Figure 4A:
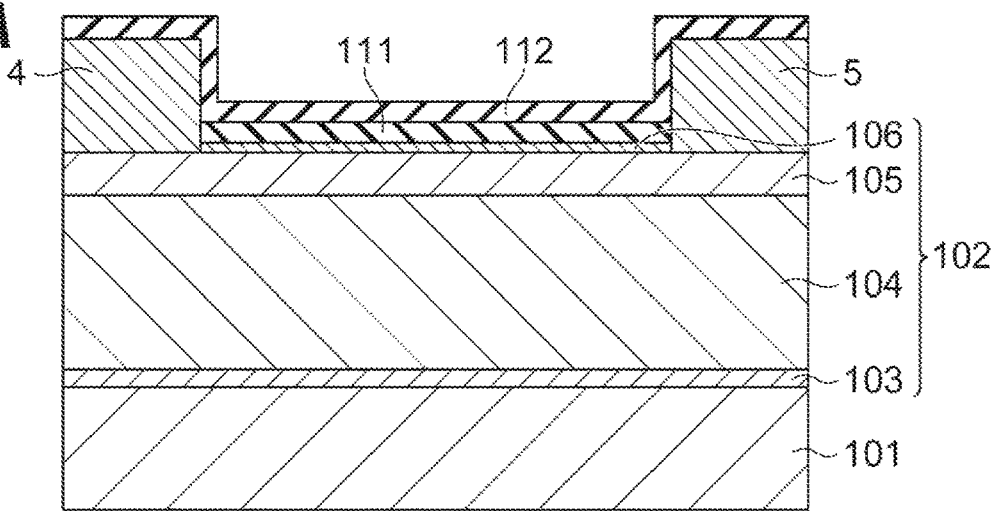
FIGS. 4A to 4C are diagrams illustrating a method of manufacturing the transistor according to the embodiment.

Subsequently, as shown in FIG. 4A, a second SiN film 112 is formed on the first SiN film 111. The second SiN film 112 covers the first SiN film 111, the drain electrode 4 and the source electrode 5. In this step, the second SiN film 112 is formed by plasma CVD using, for example, silane gas and ammonia gas as raw materials.

Figure 4B:
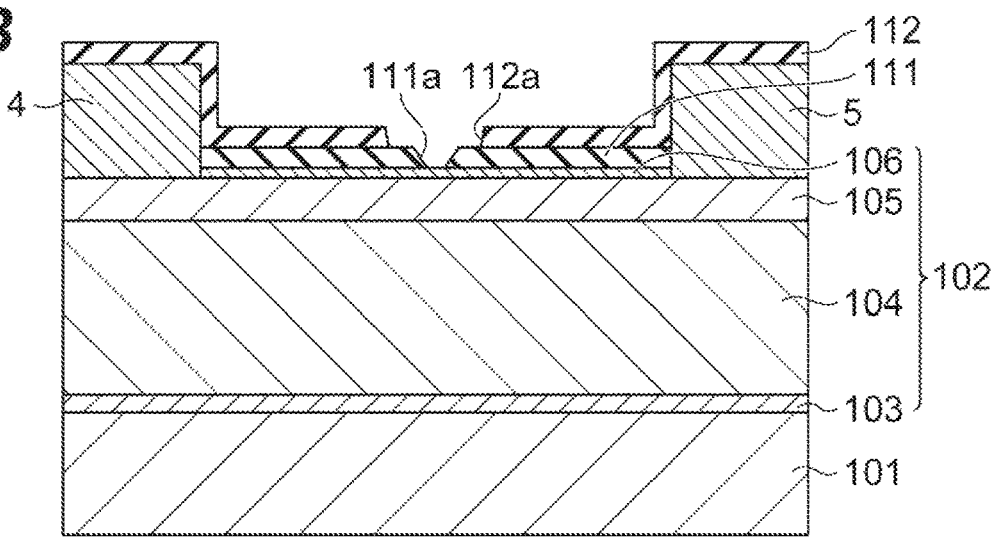

Subsequently, as shown in FIG. 4B, an opening 112a is formed in the second SiN film 112, and a gate opening 111a is formed in the first SiN film 111. In this step, the opening 112a and the gate opening 111a are continuously formed by plasma etching using, for example, a resist formed on the second SiN film 112. The etching conditions for the first SiN film 111 also apply to the second SiN film 112. Thus, since significant side etching occurs in the second SiN film 112, the opening width of the opening 112a provided in the second SiN film 112 is larger than the opening width of the gate opening 111a. Plasma etching is, for example, reactive ion etching (RIE). For example, a fluorine-based gas is used as the etching gas. As the fluorine-based gas, for example, one or more is selected from the group consisting of $SF_6$, $CF_4$, $CHF_3$, $C_3F_6$, and $C_2F_6$. As etching conditions in the case of using a fluorine-based gas, for example, the etching gas is set to $SF_6$, the reaction pressure is set to 2.0 Pa, and the RF power is set to 100 W, respectively.

Figure 4C:
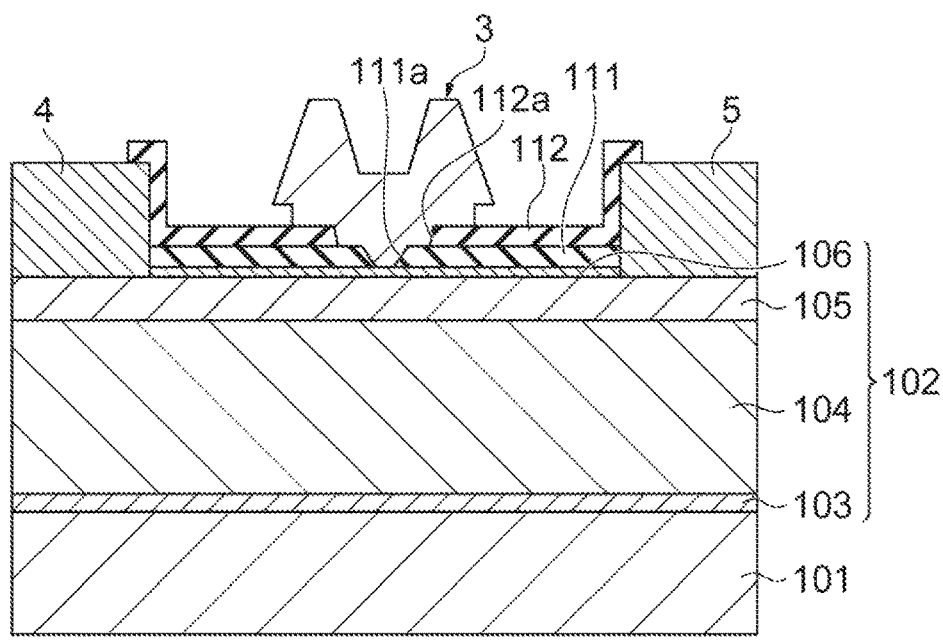

Subsequently, as shown in FIG. 4C, the gate electrode 3 filled in the gate opening 111a and the opening 112a is formed. The gate electrode 3 is formed by, for example, the PVD method and liftoff. FIG. 5 is a schematic plan view when the gate electrode 3 is formed. As shown in FIG. 5, the gate electrode 3 is formed simultaneously with the gate wiring 7 having the gate bar 11 and the gate pad 12. That is, the gate electrode 3, the gate bar 11, and the gate pad 12 are formed of the same conductor. As shown in FIG. 5, the drain electrode 4 exhibiting a substantially I-shape in plan view and the source electrode 5 having a substantially H-shape extend along the first direction D1.

Subsequently, as shown in FIGS. 6 and 7, an insulating film 113 having the openings 113a, 113b is formed on the drain electrode 4 and the source electrode 5. In this step, first, the insulating film 113 is formed on the gate electrode 3 and the second SiN film 112 by plasma CVD. Then, openings 113a, 113b for exposing the drain electrode 4 and the source electrode 5 are formed in the insulating film 113 by various etching. At this time, portions of the second SiN film 112 overlapping the openings 113a, 113b are also etched. Thus, an opening 112b overlapping the opening 113a and an opening 112c overlapping the opening 113b are formed in the second SiN film 112. In addition, an opening 113c for exposing the gate pad 12 is formed in the insulating film 113.

Figure 8A:
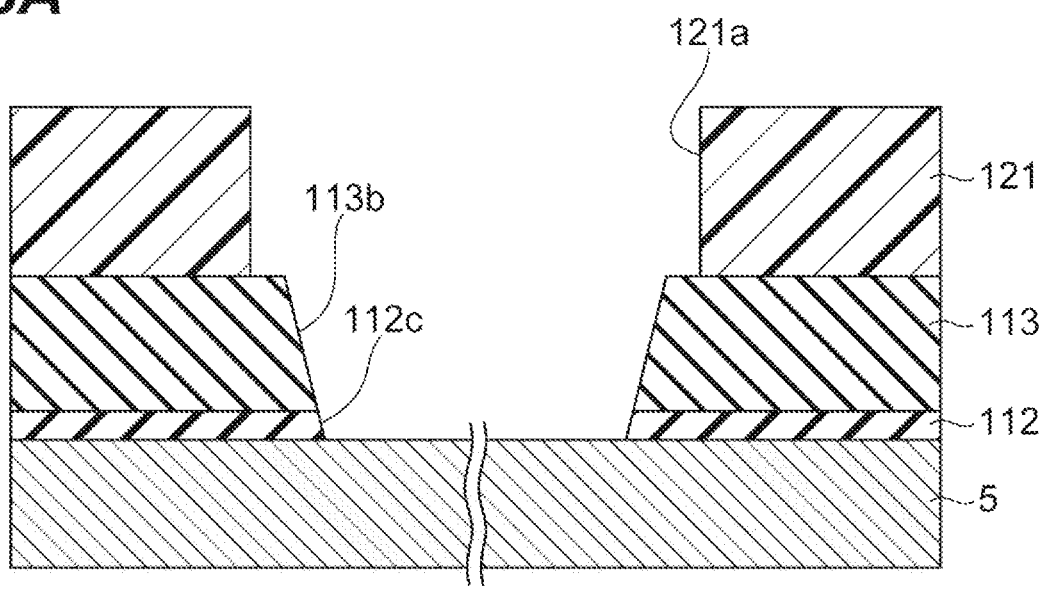
FIGS. 8A and 8B are views for explaining the method of manufacturing the transistor according to the embodiment, and are enlarged views of the method of manufacturing the vicinity of a source finger.

Here, with reference to FIGS. 8A and 8B and FIGS. 9A and 9B, a method of forming the drain wiring 8 and the source wiring 9 will be described. Below, the formation method of the source wiring 9 will be mainly described. First, as shown in FIG. 8A, a resist 121 is formed on the insulating film 113. The resist 121 is provided to selectively form the drain wiring 8 and the source wiring 9 to be formed later. An opening 121a is formed in the resist 121. The opening 121a is formed along the shape of the source wiring 9 to be formed later. Therefore, the opening 121a overlaps at least the openings 112c, 113b. In the resist 121, an opening different from the opening 121a is formed. This opening is formed along the shape of the drain wiring 8 to be formed later. Therefore, although not shown, the opening overlap at least the openings 112b, 113a. The thickness of the resist 121 is, for example, 0.5 µm or more and 2 µm or less.

Figure 8B:
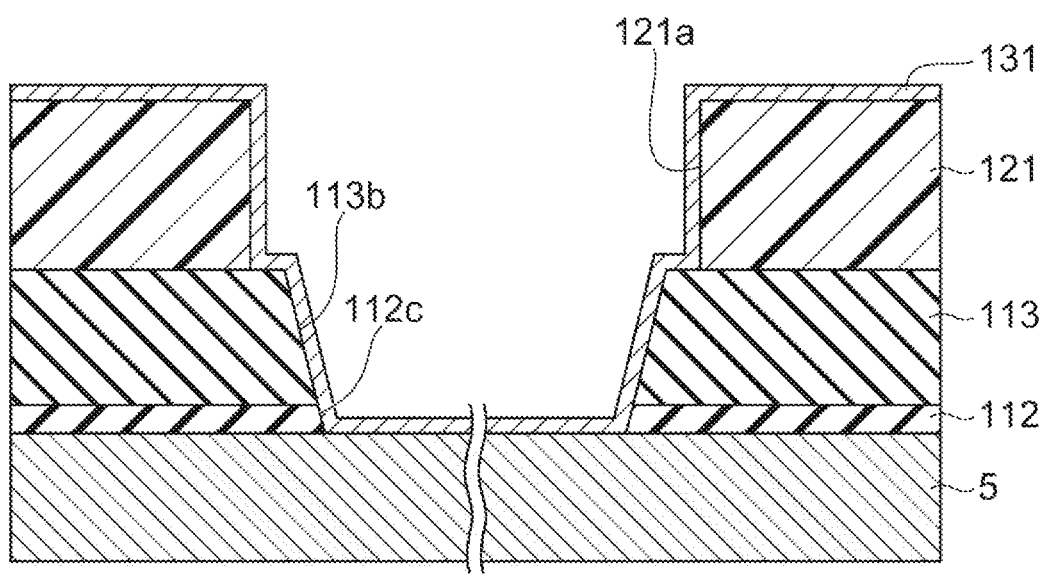

Subsequently, as shown in FIG. 8B, a seed layer 131 is formed. The seed layer 131 is a conductive layer formed by PVD such as sputtering, for example. The seed layer 131 is formed on the exposed surfaces of the second SiN film 112 and the insulating film 113 in addition to the surface of the resist 121. Therefore, the edges of the openings 112b, 112c, 113a, 113b are covered by the seed layer 131. The seed layer 131 has, for example, a stacked structure of a Ti layer and an Au layer. The Ti layer exhibits good adhesion to the exposed surfaces of the second SiN film 112, the insulating film 113 and the like. The Au layer functions as a seed metal in a plating process to be described later. The thickness of the seed layer 131 is, for example, 100 nm or more and 300 nm or less.

Figure 9A:
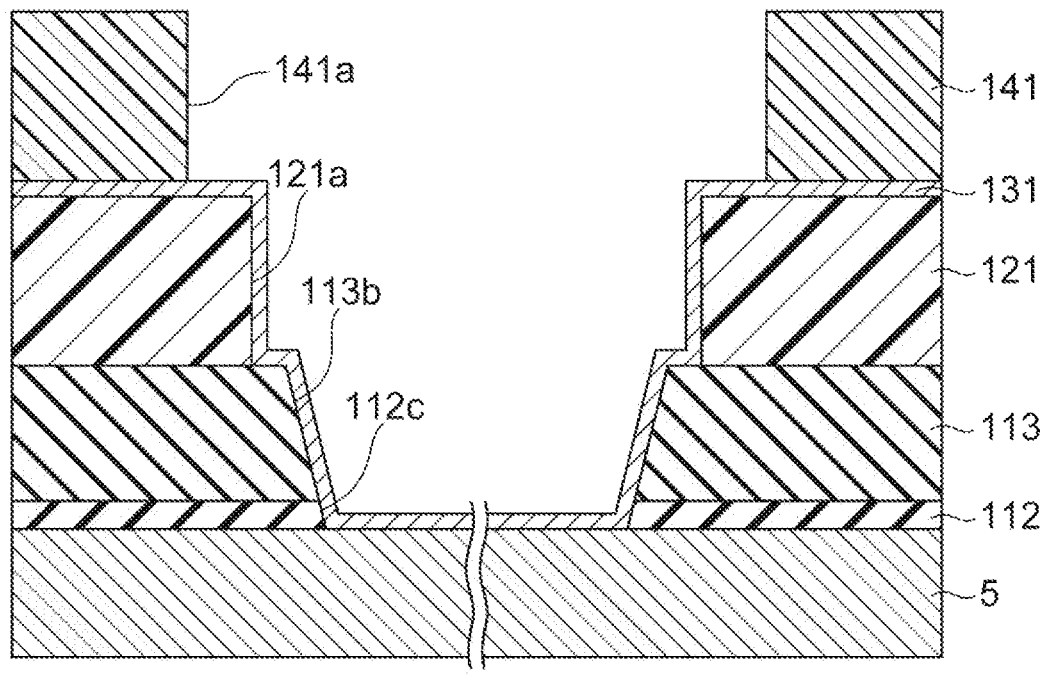
FIGS. 9A and 9B are views for explaining the method of manufacturing the transistor according to the embodiment, and are enlarged views of the method of manufacturing the vicinity of the source finger.

Subsequently, as shown in FIG. 9A, a resist 141 is formed on the seed layer 131. The resist 141 is formed to selectively perform plating using the seed layer 131. An opening 141a is formed in the resist 141. The opening 141a is formed along the shape of the source wiring 9 to be formed later, similarly to the opening 121a of the resist 121. The opening width of the opening 141a is larger than the opening width of the opening 121a of the resist 121. In the resist 141, an opening different from the opening 141a is formed. This opening is formed along the shape of the drain wiring 8 to be formed later, and overlaps at least the openings 112b, 113a. The thickness of the resist 141 is, for example, 3 µm or more and 6 µm or less.

Figure 9B:
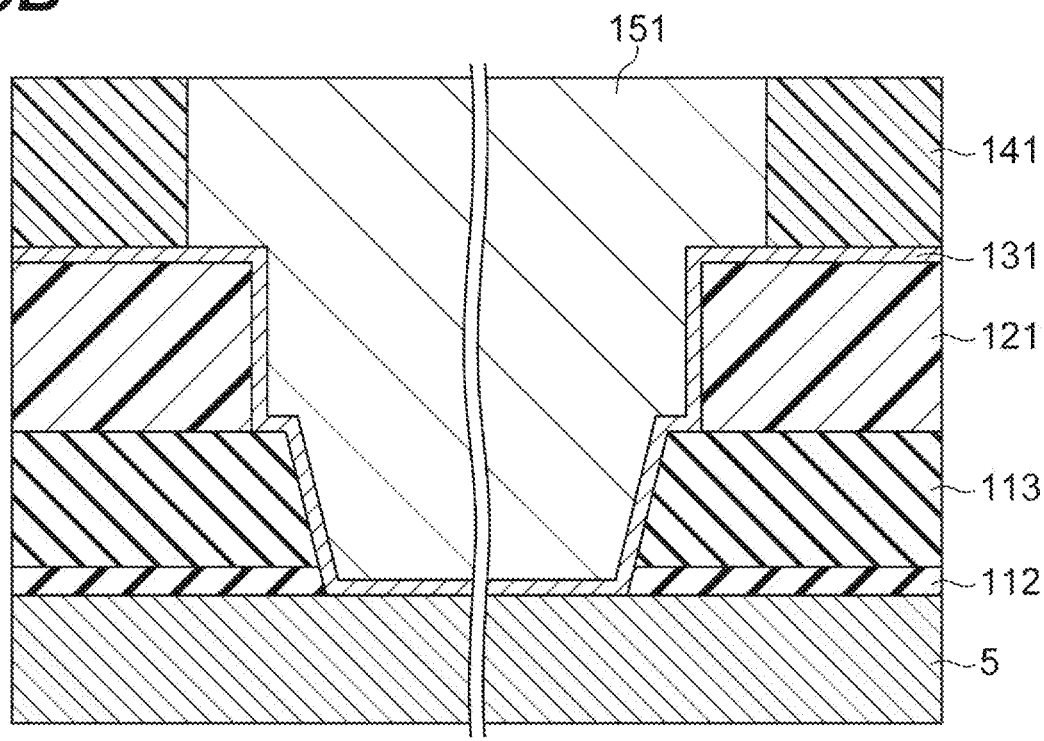

Subsequently, as shown in FIG. 9B, plating using the seed layer 131 is performed. Thereby, the plating layer 151 is formed on the seed layer 131 exposed from the resist 141. The plating layer 151 is, for example, an Au layer formed by electrolytic plating. The thickness of the plating layer 151 is sufficiently thicker than the seed layer 131, and is, for example, 2 µm or more and 5 µm or less. In one example, the electrolytic plating is carried out under a condition that the temperature of the plating solution is 60° C. or more and 85° C. or less, the flow rate of the plating solution is 12 or more liters/minute and 25 liters/minute, and the current density during plating is 0.1 A/dm$^2$ or more and 0.2 A/dm$^2$ or less. The plating solution is, for example, a cyan solution.

After the plating layer 151 is formed, the resist 141 is removed. After removing the resist 141, the seed layer 131 exposed from the plating layer 151 is removed. For example, the entire surface on which the seed layer 131 is provided is etched. As described above, the plating layer 151 is sufficiently thicker than the seed layer 131. Therefore, even if the etching is performed, only the seed layer 131 exposed from the resist 141 can be removed. Then, the resist 121 is removed. Thus, the source wiring 9 is formed. Simultaneously with the formation of the source wiring 9, the drain wiring 8 is also formed. Through the above steps, the transistor 1 shown in FIG. 1 is formed.

Figure 10:
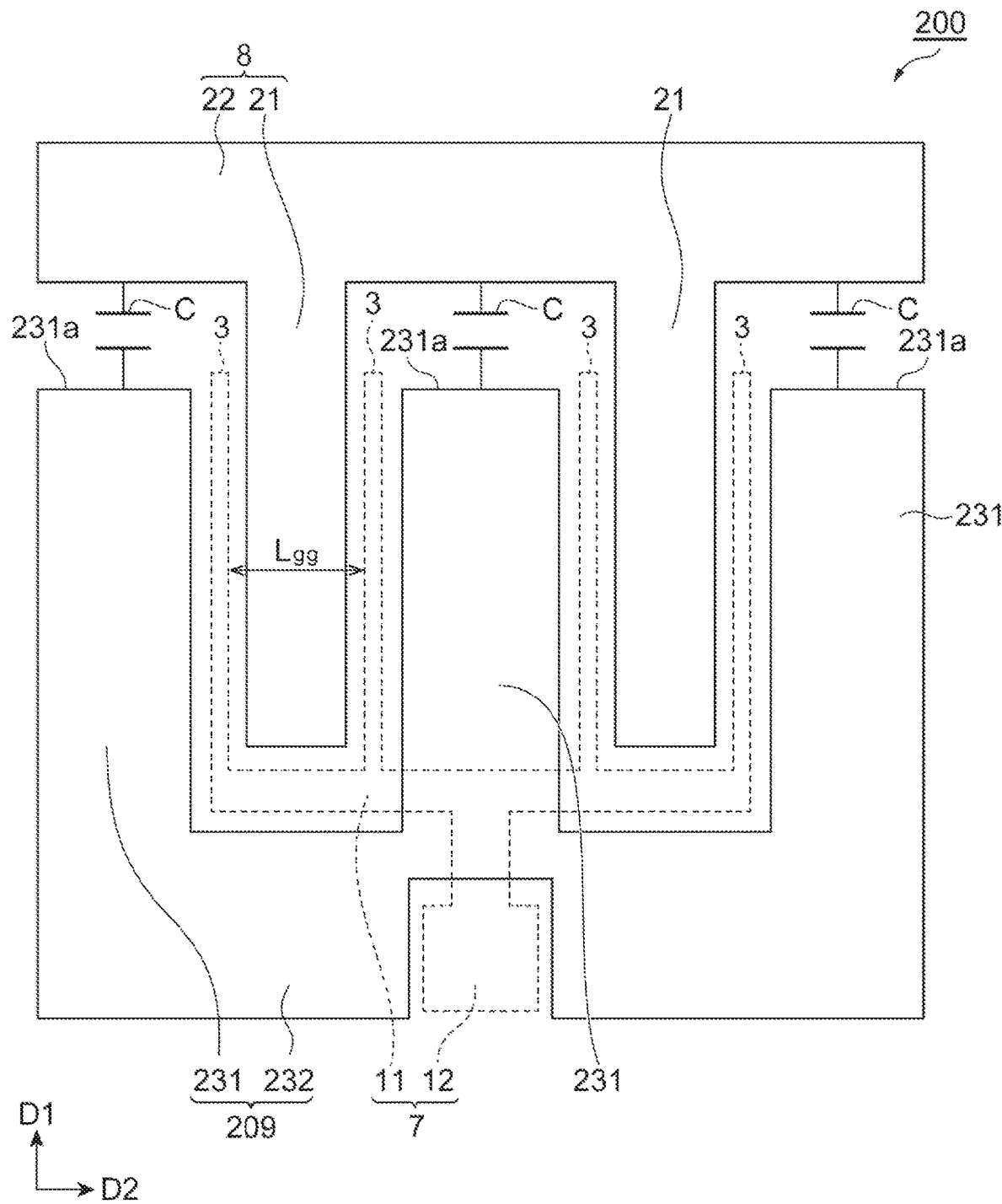
FIG. 10 is a schematic plan view illustrating a transistor in the prior art.

The functions and effects obtained by the transistor 1 according to the present embodiment described above will be described with reference to FIG. 10. FIG. 10 is a schematic plan view illustrating a transistor in the prior art. As shown in FIG. 10, the source wiring 209 of the transistor 200 in the prior art has a source finger 231 having a substantially I-shape in plan view, and a source bar 232 connected to the source finger 231. That is, a depression is not provided in the source finger 231 in the prior art. Although not shown, the source finger 231 has a shape corresponding to the planar shape of the source electrode. Here, in general, in the multi-finger transistor, the interval (Lgg) between adjacent gate electrodes is set to 100 µm or more. In addition, longer Lgg tends to suppress local heat generation. On the other hand, the side 231a of the source finger 231 opposed to the drain bar 22 in plan view becomes longer as the Lgg becomes longer. In this case, the parasitic capacitance C between the side 231a and the drain bar 22 is increased. For example, when the length of the side 231a is doubled, the parasitic capacitance C increases by about 30%. Therefore, as Lgg is made longer, while local heat generation is suppressed, parasitic capacitance C tends to increase.

On the other hand, the transistor 1 according to the present embodiment includes the drain finger 21 having a shape corresponding to the planar shape of the drain electrode 4, and the source finger 31 having a shape corresponding to the planar shape of the source electrode 5. Therefore, it is possible to suppress the increase in the resistance value of the transistor 1 caused by the drain finger 21 and the source finger 31 as compared with, for example, Japanese Unexamined Patent Publication No. 2001-284367. Thus, local heat generation in the transistor 1 can be suppressed. In addition, the source finger 31 has a side 31a facing the drain bar 22, and a depression 31b which is provided at the central portion of the side 31a and is depressed to a depth equal to or more than the interval between both side portions of the side 31a and the drain bar 22. Thereby, the parasitic capacitance between the central portion of the side 31a and the drain bar 22 is significantly smaller than the parasitic capacitance between the side portions of the side 31a and the drain bar 22. Therefore, even if Lgg is made longer, the increase in parasitic capacitance between the source finger 31 and the drain bar 22 can be suppressed. Therefore, according to the transistor 1 according to the present embodiment, local heat generation and increase in parasitic capacitance can be suppressed.

Further, the source electrode 5 has a side 5a facing the drain bar 22, and a depression 5c which is provided at the central portion of the side 5a and is depressed to a depth equal to or more than the interval S1 between both side portions of the side 5a and the drain bar 22. Thereby, the parasitic capacitance between the central portion of the side 5a and the drain bar 22 is significantly smaller than the parasitic capacitance between the side portion of the side 5a and the drain bar 22. Therefore, even if Lgg is increased, not only the increase in parasitic capacitance between the source finger 31 and the drain bar 22 but also the increase in parasitic capacitance between the source electrode 5 and the drain bar 22 can be suppressed.

As in the present embodiment, the plating layer 151 which is the main portion of the drain wiring 8 and the source wiring 9 may be formed under a condition that the temperature of the plating solution is 60° C. or more and 85° C. or less, the flow rate of the plating solution is 12 liters/minute or more and 25 liters/minute, and the current density during plating is 0.1 A/dm$^2$ or more and 0.2 A/dm$^2$ or less. In the present embodiment, the temperature of the plating solution is raised more than the general temperature in a range not affecting the resists 121 and 141. In addition, the flow rate of the plating solution is increased more than general, and the current density is decreased more than general. Therefore, in the present embodiment, the plating layer 151 can be favorably formed even for the fine pattern.

The transistor 1 according to the present embodiment includes a gate wiring 7 located between the source bar 32 and the active region 2, extending along the second direction D2, and being connected to the gate electrode 3, in which a depression 5d which is provided at the central portion of the side 5b facing the gate wiring 7 in the source electrode 5 and is depressed to a depth equal to or more than the interval S2 between the both side portions of the side 5b and the gate wiring 7. In this case, the parasitic capacitance between the central portion of the side 5b and the gate wiring 7 is also significantly smaller than the parasitic capacitance between the side portions of the side 5b and the gate wiring 7. Therefore, even if Lgg is increased, not only the increase in parasitic capacitance between the source finger 31 and the drain bar 22 but also the increase in parasitic capacitance between the source electrode 5 and the gate wiring 7 can be suppressed.

As in the present embodiment, the source finger 31 may have an opening 31c overlapping the depression 5d. In this case, parasitic capacitance between the source finger 31 and the gate wiring 7 can be reduced.

In the present embodiment, the interval S3 along the first direction D1 between the depression 5c and the depression 5d may be $^{150}\!/\!_{350}$ or less of the length d3 of the source electrode 5 along the first direction D1. In this case, the total value of the parasitic capacitance of the source electrode 5 and the drain bar 22 and the parasitic capacitance of the source electrode 5 and the gate wiring 7 can be well suppressed.

Figure 11:
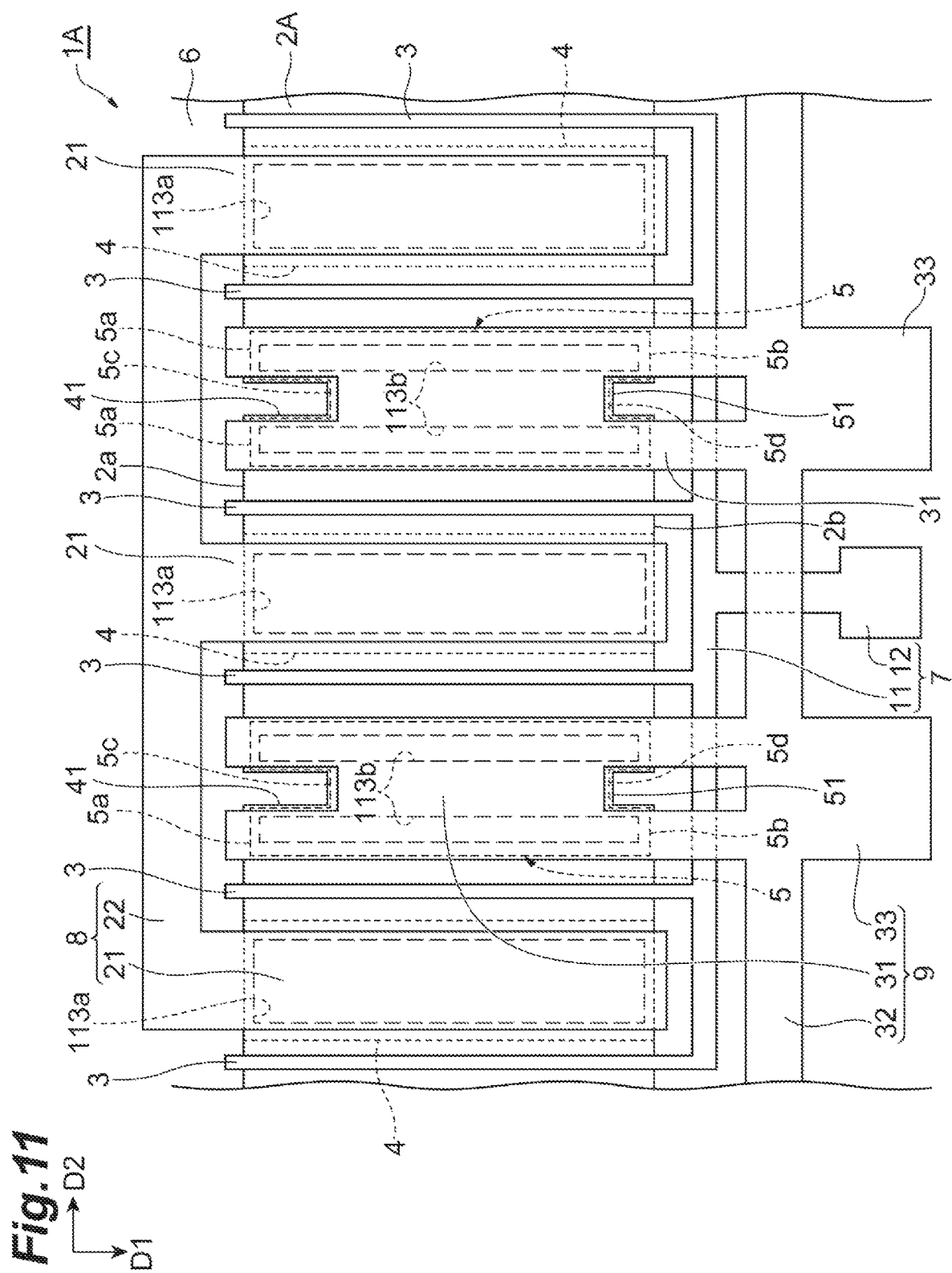
FIG. 11 is a schematic plan view of a transistor according to a modification example.

Next, a modification example of the above embodiment will be described using FIG. 11. FIG. 11 is a schematic plan view of a transistor according to a modification example. The transistor 1A shown in FIG. 11 has an active region 2A having a shape different from that of the transistor 1 of the embodiment. The active region 2A has a mesa structure, and depressions 41 and 51 are provided in a part of the active region 2A. Specifically, on the side 2a (third side) facing the drain bar 22 in the active region 2A, a depression 41 (third depression) depressed along the depression 5c is provided. Therefore, at least a part of the depression 5c overlaps the inactive region 6. On the side 2b facing the gate bar 11 in the active region 2A, a depression 51 depressed along the depression 5d is provided. Therefore, at least a part of the depression 5d also overlaps the inactive region 6. Even with such a modification example, the same operation and effect as the above embodiment can be obtained. In addition, the parasitic capacitance of the transistor 1A can be reduced better.

The semiconductor device according to the present disclosure is not limited to the above-described embodiment and modification example, and various modifications are possible. For example, although the depression is provided in both the source electrode and the source finger in the above embodiment and the above modification example, the present invention is not limited to this. A depression may be provided at the center of the side of the drain electrode facing the gate bar. Alternatively, a depression may be provided at the central portion of the side of the source electrode facing the gate bar. In these cases, the increase in parasitic capacitance of the transistor can be further suppressed.

What is claimed is:

1. A semiconductor device comprising:
   a substrate;
   an active region and an inactive region surrounding the active region, the active region and the inactive region being located on the substrate;
   a gate electrode, a drain electrode and a source electrode on the active region, the gate electrode, the drain electrode and the source electrode extending in a first direction;
   a drain interconnection including:
      a drain finger having a pattern along a planer shape of the drain electrode; and
      a drain bar on the inactive region, the drain bar extending in a second direction intersecting with the first direction and being connected to the drain finger; and
   a source interconnection including:
      a source finger having a pattern along a planar shape of the source electrode; and
      a source bar on the inactive region, the source bar extending in the second direction and being connected to the source finger,
   wherein the source bar is located on an opposite side of the drain bar across the active region in the first direction,
   wherein the source electrode includes a first side facing the drain bar in the first direction and a first depression in a middle of the first side, and
   wherein a first depth of the first depression in the first direction is equal or more than a first interval between the drain bar and the first side in the first direction.

2. The semiconductor device according to claim 1, further comprising a gate bar located between the active region and the source bar in the second direction, the gate bar being connected to the gate electrode,
   wherein the source electrode includes a second side facing the gate bar in the first direction and a second depression in a middle of the second side, and
   wherein a second depth of the second depression in the first direction is equal or more than a second interval between the gate bar and the second side in the first direction.

3. The semiconductor device according to claim 2,
wherein the source finger includes an opening overlapping the second depression.

4. The semiconductor device according to claim 2,
wherein a third interval between the first depression and the second depression in the first direction is $^{150}/_{350}$ or less of a length of the source electrode in the first direction.

5. The semiconductor device according to claim 1,
wherein the active region includes a third side facing the drain bar in the first direction and a third depression overlapping the first depression.

6. The semiconductor device according to claim 2,
wherein the active region includes a fourth side facing the source bar in the first direction and a fourth depression overlapping the second depression.

7. The semiconductor device according to claim 1,
wherein the source finger includes a fifth depression overlapping the first depression.

8. A semiconductor device comprising:
an active region and an inactive region surrounding the active region;
a gate electrode, a drain electrode and a source electrode on the active region, the gate electrode, the drain electrode and the source electrode extending in a first direction;
a drain interconnection including a drain bar on the inactive region, the drain bar extending in a second direction intersecting with the first direction and being electrically connected to the drain electrode; and
a source interconnection including a source bar on the inactive region, the source bar extending in the second direction and being electrically connected to the source electrode,
wherein the source bar is located on an opposite side of the drain bar across the active region in the first direction,
wherein the source electrode includes a first side facing the drain bar and a first depression in a middle of the first side, the first depression being depressed from the first side to a, middle of the source electrode in a plan view, and
wherein a first depth of the first depression in the first direction is equal or more than a first interval between the drain bar and the first side in the first direction.

9. The semiconductor device according to claim 8, further comprising a gate bar located between the active region and the source bar in the second direction, the gate bar being connected to the gate electrode,
wherein the source electrode includes a second side facing the gate bar in the first direction and a second depression in a middle of the second side, and
wherein a second depth of the second depression in the first direction is equal or more than a second interval between the gate bar and the second side in the first direction.

10. The semiconductor device according to claim 9,
wherein a third interval between the first depression and the second depression in the first direction is $^{150}/_{350}$ or less of a length of the source electrode in the first direction.

11. The semiconductor device according to claim 9,
wherein the source interconnection further comprises a source finger on the source electrode and connected to the source bar, and
wherein the source finger includes an opening overlapping the second depression.

12. The semiconductor device according to claim 8,
wherein the active region includes a third side facing the drain bar in the first direction and a third depression overlapping the first depression.

13. The semiconductor device according to claim 9,
wherein the active region includes a fourth side facing the source bar in the first direction and a fourth depression overlapping the second depression.

14. The semiconductor device according to claim 8,
wherein the source interconnection further comprises a source finger on the source electrode and connected to the source bar, and
wherein the source finger includes a fifth depression overlapping the first depression.

* * * * *